United States Patent
Ian et al.

(10) Patent No.: US 10,839,305 B2
(45) Date of Patent: Nov. 17, 2020

(54) MULTI-BAND COUPLING FOR SUPERCONDUCTING QUBITS BASED ON COPLANAR CROSS-SHAPE RESONATORS

(71) Applicant: UNIVERSITY OF MACAU, Macau (CN)

(72) Inventors: Hou Ian, Macau (CN); Yan Zhang, Macau (CN); Kam Weng Tam, Macau (CN)

(73) Assignee: University of Macau, Macau (CN)

( * ) Notice: Subject to any disclaimer, the term of this patent is extended or adjusted under 35 U.S.C. 154(b) by 0 days.

(21) Appl. No.: 16/019,306

(22) Filed: Jun. 26, 2018

(65) Prior Publication Data

US 2019/0034819 A1    Jan. 31, 2019

Related U.S. Application Data (60) Provisional application No. 62/537,255, filed on Jul. 26, 2017.

(51) Int. Cl.
| | | |
|---|---|---|
| *G06N 99/00* | (2019.01) | |
| *G06N 10/00* | (2019.01) | |
| *H01L 39/22* | (2006.01) | |
| *B82Y 10/00* | (2011.01) | |
| *H03K 19/195* | (2006.01) | |

(52) U.S. Cl.
CPC .............. *G06N 10/00* (2019.01); *B82Y 10/00* (2013.01); *H01L 39/223* (2013.01); *H03K 19/195* (2013.01)

(58) Field of Classification Search
CPC ...... B82Y 10/00; H03K 19/195; G06N 10/00; H01L 39/223
See application file for complete search history.

(56) References Cited

U.S. PATENT DOCUMENTS 9,369,133 B2 *   6/2016   Naaman ............. H03K 19/1958

OTHER PUBLICATIONS

"Superconducting quantum bits," Nature, vol. 453,Jun. 19, 2008, doi:10.1038/nature07128,12 pages. (Year: 2008).*
Abdumalikov et al. "Vaccuum Rabi splitting due to strong coupling of a flux qubit and a coplanar-waveguide resonator," Physical Review B 78, 180502(R) 2008, 4 pages.
Blais et al. "Cavity quantum electrodynamics for superconducting electrical circuits: An architecture for quantum computation," Physical Review A 69, 062320 (2004), 14 pages.
Bogorin et al. "Copper Waveguide Cavities With Reduced Surface Loss for Coupling to Superconducting Qubits," IEEE Transactions on Applied Superconductivity, vol. 24, No. 4, Aug. 2014, 7 pages.
Buttiker "Zero-current persistent potential drop across small-capacitance Josephson junctions," vol. 36, No. 7, Sep. 1, 1987, 8 pages.

(Continued)

*Primary Examiner* — Ermias T Woldegeorgis
(74) *Attorney, Agent, or Firm* — Arch & Lake LLP (57) ABSTRACT

Multi-mode resonator is usually used to design broadband bandpass filters and the cross-shape resonator (CSR) is one of its typical types. The possibility of utilizing cross-shape multi-mode resonators is explored as a signal controller for superconducting qubits that are coplanar to the resonator. The multi-mode qubit-resonator coupling facilitates the design of future quantum information processor.

13 Claims, 7 Drawing Sheets

(56) References Cited

OTHER PUBLICATIONS

Chu and Tian "Design of UWB Bandpass Filter Using Stepped-Impedance Stub-Loaded Resonator," IEEE Microwave and Wireless Components Letters, vol. 20, No. 9, Sep. 2010, 3 pages.
Clarke and Wilhelm, "Superconducting quantum bits," Nature, vol. 453, Jun. 19, 2008, doi:10.1038/nature07128, 12 pages.
Haroche and Kleppner, "Cavity Quantum Electrodynamics," Physics Today, 42(1), 24 (1989), http://dx.doi.org/10.1063/1.881201, 8 pages.
Lloyd "Almost Any Quantum Logic Gate is Universal," Physical Review Letters, vol. 75, No. 2, Jul. 10, 1995, 4 pages.
Orlando et al. "Superconducting persistent-current qubit," Physical Review B, vol. 60, No. 22, Dec. 1, 1999, 16 pages.
Qiu et al. "Coupling spin ensembles via superconducting flux qubits," Physical Review A 89, 042321 (2014) 7 pages.
Van der Wal et al., "Quantum Superposition of Macroscopic Persistent-Current States," www.sciencemag.org, Science, vol. 290, Oct. 27, 2000, 5 pages.
Wang et al. "Design of Ultra-Wideband Bandpass Filters With Fixed and Reconfigurable Notch Bands Using Terminated Cross-Shaped Resonators," IEEE Transactions on Microwave Theory and Techniques, vol. 62, No. 2, Feb. 2014, 14 pages.
Wang et al. "A Wideband Differential BPF With Multiple Differential- and Common-Mode Transmission Zeros Using Cross-Shaped Resonator," IEEE Microwave and Wireless Components Letters, vol. 24, No. 12, Dec. 2014, 3 pages.

\* cited by examiner

MULTI-BAND COUPLING FOR SUPERCONDUCTING QUBITS BASED ON COPLANAR CROSS-SHAPE RESONATORS

CROSS REFERENCE TO RELATED APPLICATIONS

The application is based on, claims priority to, and incorporates herein by reference in its entirety, U.S. Provisional Patent Application Ser. No. 62/537,255, filed on Jul. 26, 2017, and entitled "Multi-Band Coupling for Superconducting Qubits based on Coplanar Cross-shape Resonators."

TECHNICAL FIELD

The present disclosure is related to the field of multi-band coupling technology, and more particularly to multi-band coupling for superconducting qubits.

BACKGROUND

Cavity quantum electrodynamics (QED) studies the resulting effects of the interaction between light quantized in a cavity and matter on its atomic scale. Such a cavity QED system can be implemented on a superconducting circuit, which consists of a superconducting qubit device that acts as the atomic matter and a stripped waveguide that acts as the cavity.

BRIEF DESCRIPTION OF THE DRAWINGS

The accompanying drawings, which are incorporated in and constitute a part of this specification, illustrate embodiments consistent with the disclosure and, together with the description, serve to explain the principles of the disclosure.

Skilled artisans will appreciate that elements in the figures are illustrated for simplicity and clarity and have not necessarily been drawn to scale. For example, the dimensions and/or relative positioning of some of the elements in the figures may be exaggerated relative to other elements to help to improve understanding of various examples of the present disclosure. Also, common but well-understood elements that are useful or necessary in a commercially feasible example are often not depicted in order to facilitate a less obstructed view of these various examples. It will further be appreciated that certain actions and/or steps may be described or depicted in a particular order of occurrence while those skilled in the art will understand that such specificity with respect to sequence is not actually required. It will also be understood that the terms and expressions used herein have the ordinary technical meaning as is accorded to such terms and expressions by persons skilled in the technical field as set forth above, except where different specific meanings have otherwise been set forth herein.

DETAILED DESCRIPTION

Descriptions will now be made in detail to exemplary embodiments, examples of which are illustrated in the accompanying drawings. When accompanying figures are mentioned in the following descriptions, the same numbers in different drawings represent the same or similar elements, unless otherwise indicated. The implementations set forth in the following description of exemplary embodiments do not represent all implementations consistent with the disclosure. Instead, they are merely examples of apparatus and methods consistent with aspects related to the disclosure as recited in the appended claims.

The terminology used in the present disclosure is for the purpose of describing exemplary examples only and is not intended to limit the present disclosure. As used in the present disclosure and the appended claims, the singular forms "a," "an" and "the" are intended to include the plural forms as well, unless the context clearly indicates otherwise. It shall also be understood that the terms "or" and "and/or" used herein are intended to signify and include any or all possible combinations of one or more of the associated listed items, unless the context clearly indicates otherwise.

It shall be understood that, although the terms "first," "second," "third," etc. may be used herein to describe various information, the information should not be limited by these terms. These terms are only used to distinguish one category of information from another. For example, without departing from the scope of the present disclosure, first information may be termed as second information; and similarly, second information may also be termed as first information. As used herein, the term "if" may be understood to mean "when" or "upon" or "in response to" depending on the context.

Reference throughout this specification to "one embodiment," "an embodiment," "exemplary embodiment," or the like in the singular or plural means that one or more particular features, structures, or characteristics described in connection with an example is included in at least one embodiment of the present disclosure. Thus, the appearances of the phrases "in one embodiment" or "in an embodiment," "in an exemplary embodiment," or the like in the singular or plural in various places throughout this specification are not necessarily all referring to the same embodiment. Furthermore, the particular features, structures, or characteristics in one or more embodiments may be combined in any suitable manner.

A simplified superconducting circuit is proposed, which consists of one Josephson junction. The Josephson junction is a component consisting of two superconductors insulated by a thin insulator. The geometrical of each Josephson junction consists of $Al/Al_xO_y/Al$, where $x \leq 2$ and $y \leq 3$. The common size of a Josephson junction is made of 100 nm×100 nm. The most common construction of a superconducting loop consists three Josephson junctions. They are four types of superconducting qubits according to their physical parameters: phase qubits, charge qubits, flux qubits and hybrid qubits. Charge qubits taking Cooper pairs as their level states, flux qubits taking the circulating supercurrents as their states, and phase qubits taking the oscillation modes as their states. In flux qubits, anticlockwise supercurrent and clockwise supercurrent are defined as the two quantum states. By controlling external variables, for instance, the magnetic flux in the superconducting loop, the level structure of the artificial atoms are variable. The level states of flux qubits can be dressed, controlled, coupled, decoupled, and constructible. For this characteristic, cavity QED attracts lots of interests in quantum information processing.

Quantum information processing become significant for its tremendous processing ability. It can process all the possible bit strings simultaneously. As cavity QED system, it can provide long distance and quick interactions between qubits. In the researches, lumped element resonators and coplanar waveguide (CPW) resonators single-mode coupling on superconducting cavity QED system have been researched. In the single-mode case, a central conductor called a CPW resonator is separated by two narrow gaps from two ground planes. The CPW resonator used as a harmonic oscillator is coupled by a conductor acted as a capacitor at each tip of the resonator. The qubit is fabricated on the antinode of the current. In this case, only a fixed and its harmonic frequency of the qubits can couple to the electric field. Different from single-mode resonators, we proposed coplanar multi-mode resonators (MMRs) which can implement a multi-band coupling. For a multi-band coupling, superconducting qubits with different level spacings can be coupled to electric field modes. The MMR is recently a versatile structure to design wideband microwave filters. With the rapid development of wireless communication technology, MMR has attracted lots of attention due to its effect playing multiple single-mode resonator, which can significantly reduce the circuit size. Stub Loaded resonator (SLR) and Stepped-Impedance Resonator (SIR) are the commonly used structure of MMRs. Because of its simple structure, and the advantages of easy controlled resonant modes, SLR has been widely applied in microstrip filter design. The CSR as a MMR, which consists of four stubs, has been proposed to demonstrate an ultra-wideband microwave bandpass filters.

In this disclosure, the CSR is used to design the superconducting cavity QED construction. A CSR couples to an artificial two-level system (TLS) is implemented in the superconducting cavity QED system. In a bare two-level flux qubit, the level spacing is $hv_q = \sqrt{\varepsilon^2 + \Delta^2}$, where $\varepsilon = 2I_p(\Phi_e - \Phi_0/2)$ is the energy bias of the flux qubit depending on the external magnetic flux $\Phi_e$, $\Phi_0$ is defined as the flux quantum, $I_p$ is the persistent current in the superconducting loop. $\Delta$ is the tunneling energy of the two-level flux qubit. Typically, the tunable frequency range of the two-level flux qubit varies from 5 GHz to 10 GHz. The flux qubit is placed in the maximum of the electric field. The CSR exhibits a feature of multiple mode, for which, the system can perform couplings of superconducting qubits to multiple electric field mode. The CSR can be considered as a quantum bus which is used to store information between independent qubits. For this reason, the proposed system can implement broadening realm of quantum information processing.

We report a multi-band coupling in the superconducting cavity QED system. Since the qubit must be coplanar with the resonator, we utilize a simple MMR which is the CSR in the coplanar plane to couple with the TLS. Considering the tunable frequency of the flux qubit, two scenarios of coupling structures are proposed to satisfy the well coupling between the flux qubit and the CSR: (i) edge coupling and (ii) L-shape coupling. Two coupling structures are simulated by software such as Ansoft HFSS, which is not limited in the disclosure. Moreover, as comparison, the L-shape coupling with different lengths of the resonator are presented. With the simulation result, we exhibit a multi-band coupling of the coplanar CSRs to superconducting qubits.

Figure 1:
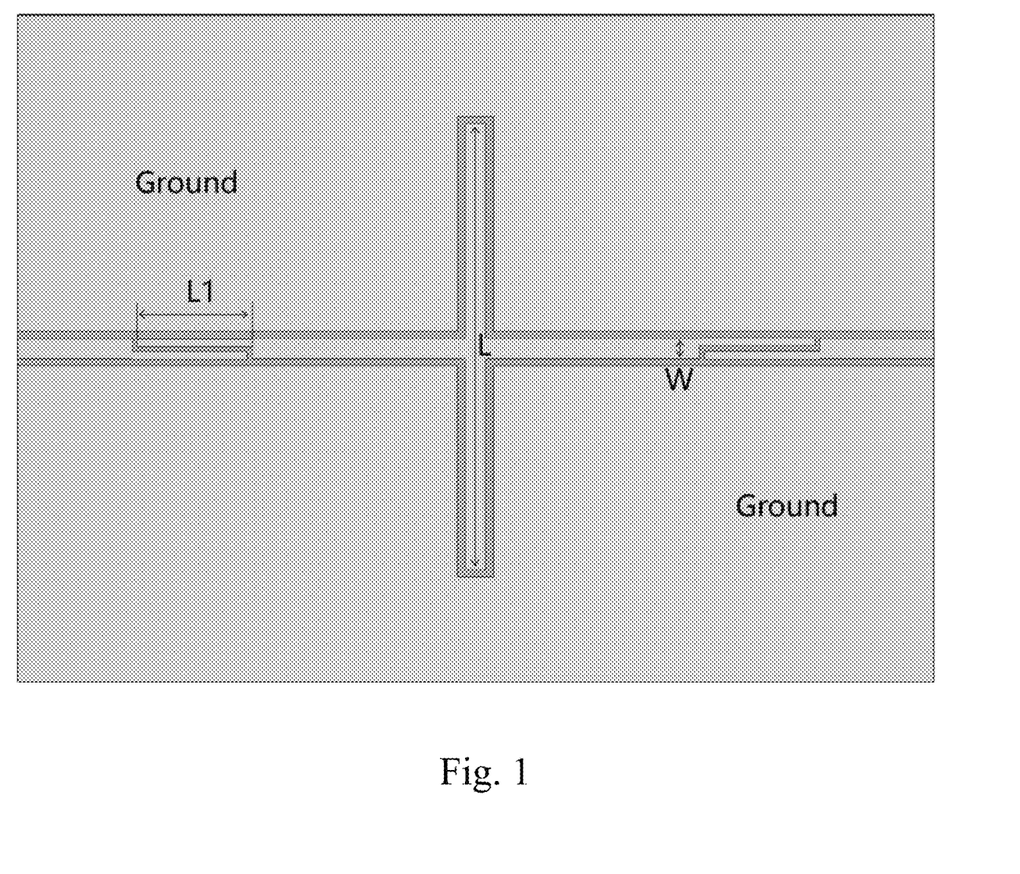
FIG. 1. illustrates the coplanar cross-shape superconducting cavity resonator with edge coupling.
Figure 2:
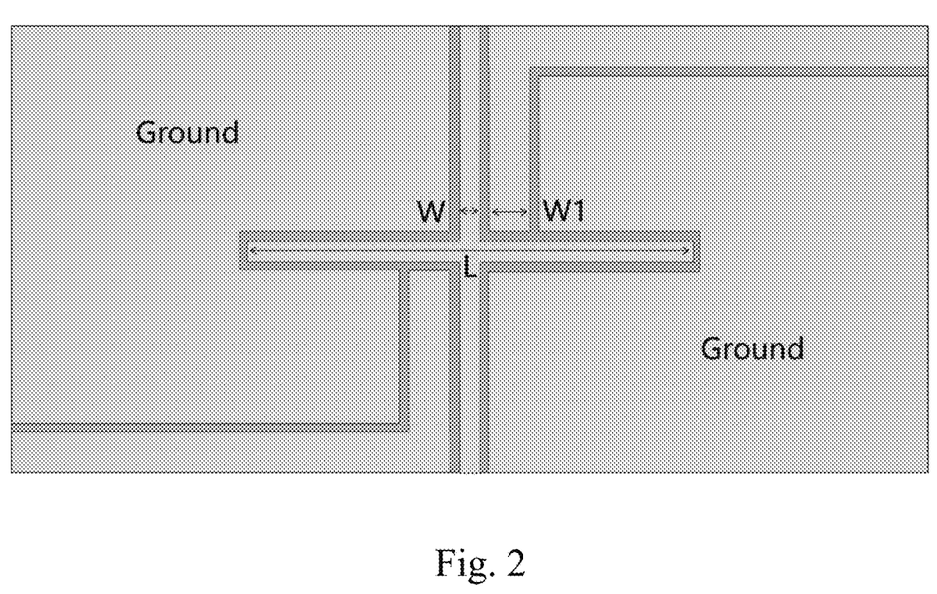
FIG. 2. illustrates the coplanar cross-shape superconducting cavity resonator with L-shape coupling.

Two coplanar CSR models with different coupling types are proposed in order to realize a multi-band coupling in the superconducting cavity due to the multiple mode of the CSR. The yellow parts indicate the conductors including the CSR, two grounds, and two coupling metals. The lavender part indicates the silicon substrate. Since the coupling between the flux qubit and the CSR occurs in the coplanar plane, all the conductors are fabricated in the top plane. Two coupling types are the edge coupling and the L-shape coupling. According to the different coupling types, two ground planes shape. Both of the ground planes in the two scenarios are designed to surround the CSR tightly. The CSR in the middle consists of four stubs, and the construction is centrosymmetric. The ground planes surround the CSR with equivalent gaps in all directions.

The coplanar CSR model with edge coupling is illustrated in FIG. 1. The CSR is placed in the central with two fluted ground planes surrounded. The CSR is coupled by a parallel conductor at each end of the two stubs in the horizontal direction capacitively. In the L-shape coupling type of the coplanar CSR model which is illustrated in FIG. 2. The CSR is coupled by a L-shape conductor along each of the two stubs in the vertical direction capacitively.

In the HFSS numerical simulation, we choose the silicon substrate for its low relative permittivity $\varepsilon_r = 3.41$ with a thickness h=635 μm, a loss tangent of tan $\delta$=0.0047. The height of the CSR is set up to t=18 μm. The conductivity is $\sigma = 5.88 \times 10^7$ S/m which is higher than the traditional conductivity of nickel $\sigma = 1.0 \times 10^7$ S/m. Gaps between the CSR and the ground plane are all set up to be G. For performing a better coupling, the gap G is set up to be a relatively smaller value, L1 and W1 are set up to a relatively larger value. Thus, the equivalent of the coupling capacitance can be a relatively larger value. For the case of working frequency f=10 GHz, the optimal physical dimensions for two coupling type are listed in Table I and Table II.

TABLE I

PHYSICAL DIMENSION PARAMETERS
OF THE EDGE COUPLING

| CSR parameters | | substrate parameters | |
|---|---|---|---|
| L | 10 mm | $\varepsilon_r$ | 3.41 |
| L1 | 5 mm | tan $\delta$ | 0.0047 |
| W | 0.15 mm | $\sigma$ | 5.88 × 10$^7$ S/m |
| G | 50 μm | h | 635 μm |
| t | 18 μm | | |

TABLE II

PHYSICAL DIMENSION PARAMETERS
OF THE L-SHAPE COUPLING

| CSR parameters | | substrate parameters | |
|---|---|---|---|
| L | 10/14 mm | $\varepsilon_r$ | 3.41 |
| W1 | 2 mm | tan $\delta$ | 0.0047 |
| W | 0.1 mm | $\sigma$ | 5.88 × 10$^7$ S/m |
| G | 50 μm | h | 635 μm |
| t | 18 μm | | |

For the proposed coplanar CSR, the HFSS simulation result is optimized so that most of the signal is trapped inside the superconducting cavity. Both of the return loss $|S_{11}|$ and the insertion loss $|S_{21}|$ should be larger as better in the tunable range of the flux qubit.

Figure 3:
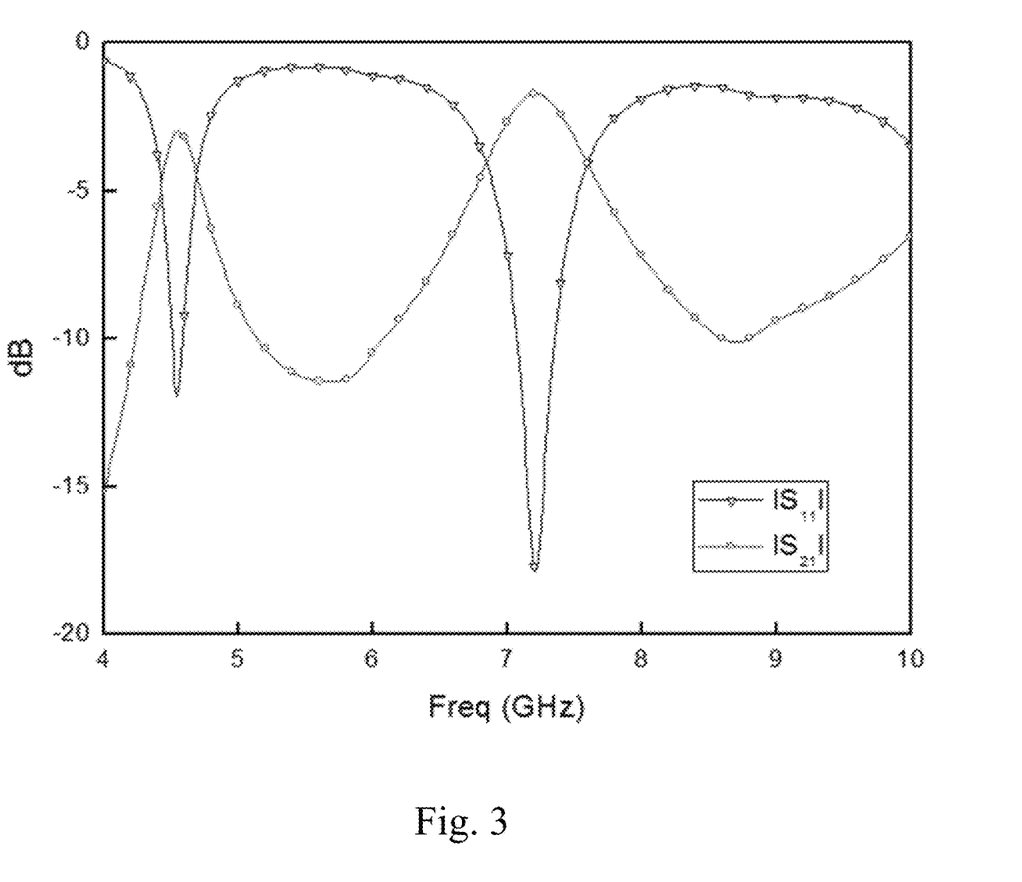
FIG. 3. Simulated S-parameters of the CSR with edge coupling.
Figure 4:
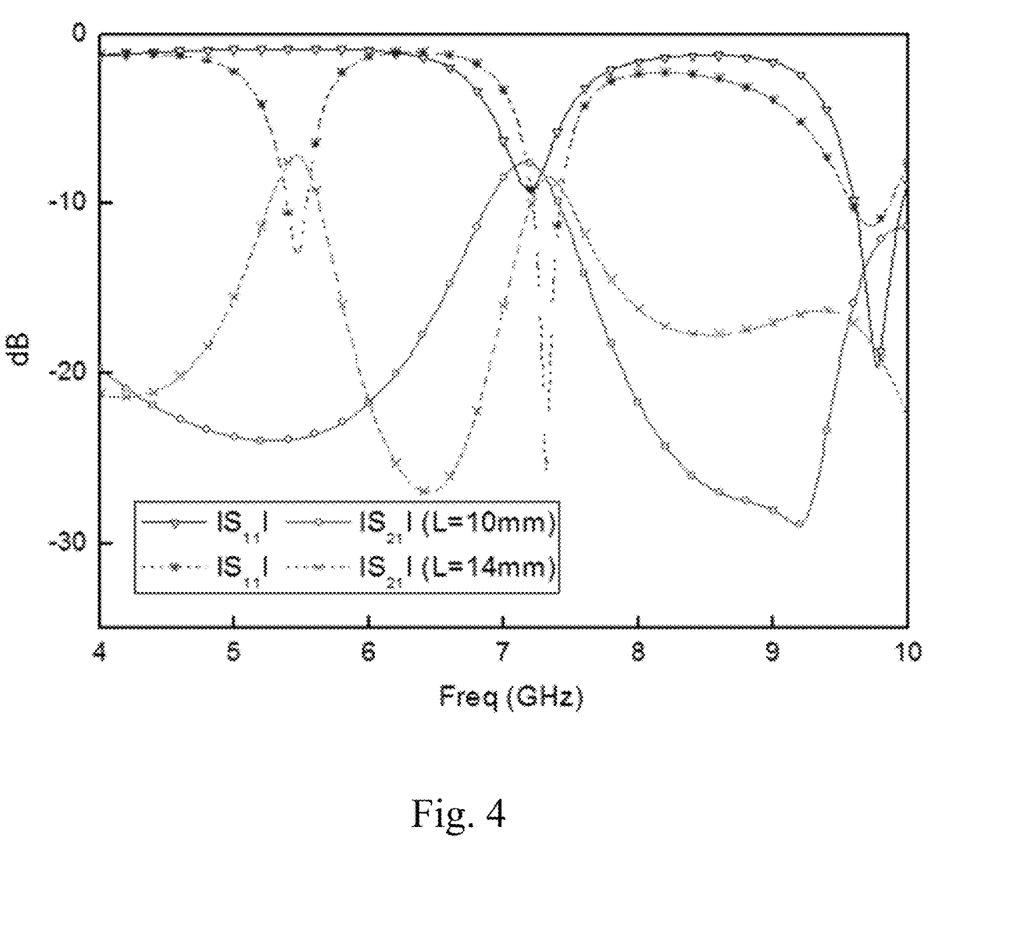
FIG. 4. Simulated S-parameters of the CSR with L-shape coupling.

FIG. 3 and FIG. 4 illustrate the simulated S-parameters of the CSR with an edge coupling and an L-shape coupling. Regarding to $|S_{11}|$, two coupling type both exhibit a feature of multiple mode. In the edge coupling type with L=10 mm, we obtain two available coupling range in the tunable frequency range 5 GHz to 10 GHz of the flux qubit. According to the simulated S-parameters, we obtain a return loss $|S_{11}|$ over 10 dB from 4.51 GHz to 4.59 GHz, and the maximum $|S_{11}|$ reaches to 11.93 dB at 4.55 GHz. We observe a return loss $|S_{11}|$ over 10 dB from 7.07 GHz to 7.35 GHz, and the maximum $|S_{11}|$ reaches to 17.85 dB at 7.21 GHz. Though at frequencies 4.45 GHz and 7.21 GHz, the return loss $|S_{11}|$ is large enough, the insertion loss $|S_{21}|$ is not large enough. This may affect the coupling performance.

In the L-shape coupling type, we present two simulations with L=10 mm and L=14 mm. In FIG. 4, we also obtain two available coupling frequency range. According to the simulated S-parameters with L=14 mm indicated by the dashed curve, we obtain $|S_{11}|$ over 10 dB from 5.39 GHz to 5.54 GHz, and the maximum $|S_{11}|$ reaches to 12.91 dB at 5.47 GHz. We observe $|S_{11}|$ over 10 dB from 7.21 GHz to 7.42 GHz, and the maximum $|S_{11}|$ reaches to 25.71 dB at 7.31 GHz. In the simulated S-parameters with L=10 mm indicated by the solid line, considering the tunable frequency range of the flux qubit, only one coupling range are useful, which is from 9.6 GHz to 9.96 GHz. The maximum $|S_{11}|$ is 19.65 at 9.77 GHz. As comparison, the L-shape coupling type with L=14 mm performs better.

Compared with the edge coupling type, the L-shape coupling type of L=14 mm shows a relatively better coupling characteristic, and both of $\uparrow S_{11}|$ and $|S_{21}|$ is large enough. Considering the tunable range 5 GHz to 10 GHz of the flux qubit, it is possible to demonstrate the coupling between the qubit and the resonator. For the edge coupling model, the perfect two coupling frequencies are 4.55 GHz and 7.21 GHz. For the L-shape coupling model, the perfect two coupling frequencies are 5.47 GHz and 7.31 GHz. The L-shape coupling type of L=14 mm is the best candidate in our simulations.

Figure 5:
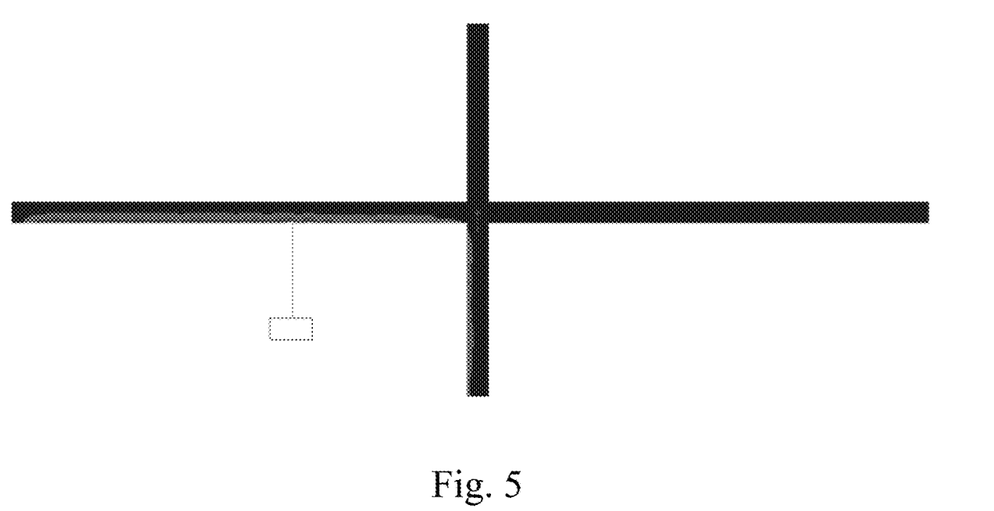
FIG. 5. Magnitude representation of the electric field with L-shape coupling.

FIG. 5 shows the electric field in the L-shape coupling coplanar model with L=14 mm. According to the color contrast, we observe the maximum electric field strength is in the yellow-color range. The maximum electric field strength in the yellow-color range varies from $1.87 \times 10^5$ V/m to $12.49 \times 10^5$ V/m.

The superconducting circuit consists of three Josephson junctions, two of the junctions have equal Josephson energy $E_J$ and capacitor C, while the third junction has a smaller Josephson energy $\alpha E_J$ and $\alpha C$. We fabricate the qubit on silicon substrate, and on the antinode of the current. Typically, the tunable frequency range of the TLS varies from 5 GHz to 10 GHz. The experiment operates in temperatures 10-30 mK. For T=10 mK, $\kappa_B T \approx 0.2$ GHz, which is far less than the frequency of a flux qubit. At this low temperature, a flux qubit can be kept in the ground state. The coupling constant supposes to be $g = MI_p I_{r0}$ between the qubit and the microwave cavity modes, and $I_{r0}$ is the resonator zeropoint current. With this field energy, we can place the flux qubit configured in a ~1 μm loop at the maximum electric field point for implementing the multi-band coupling which are indicated in the amplifying black box of FIG. 5. Furthermore, since the level spacings of the TLS can be tuned by an external magnetic flux $\Phi_e$, we can also adjust the level spacing for a multi-mode coupling in the experiment.

In studies, a single-mode coupling of a CPW resonator and a superconducting qubit has been proposed. Due to the single mode of the CPW resonator, only a fixed level-spacing qubit can be coupled. Thus, we proposed a CSR structure, with which a qubit with different level spacings can be coupled to multi-mode electric waves.

This disclosure provides a multi-band coupling in a superconducting cavity QED system utilizing a simple MMR called the CSR. Two coplanar CSR structure have been proposed according to different coupling types of the CSR. One is the edge coupling, another is the L-shape coupling. Different lengths of the resonator of the L-shape coupling are presented as comparison. With the simulation results of HFSS, both types are observed to exhibit a multi-band characteristic. According to the return loss $|S_{11}|$, and the insertion loss $|S_{21}|$, we find the L-shape coupling with L=14 mm performs better than the edge coupling. For a better coupling performance, the L-shape coupling can be used in the superconducting cavity QED system.

In the disclosure, superconducting resonators are superconducting wire segments that can store certain standing electromagnetic wave modes and are used to couple to superconducting quantum devices for implementing quantum information operations. The coupling geometry confines the resonators to be coplanar with the quantum devices and thus they are mostly striplines stripped off from coplanar waveguides patterned on the microscopic circuits. The stripline shape constrains the resonators to contain only a single electromagnetic mode of a fundamental frequency inversely proportional to its length and it harmonics whose frequencies being integer multiples of the fundamental frequency. Since the quantum devices such as qubits have uneven quantized level structures, these resonators can only couple to one level spacing at a time.

The design of a cross-shape resonator coplanar to the L-shape input-output waveguides enables the extension from single-mode to multi-band in the microwave range from 1 GHz to over 10 GHz, where each band measures one to a few hundred MHz across depending on the coupling geometry. The extension allows the storage of standing electromagnetic wave signals over a wide-band continuum, making the resonator-qubit coupling coupled to multiple qubits of non-uniform level spacings simultaneously, which is to the key to scalable quantum computation using solid-state superconducting qubits. Furthermore, multi-band couplings permit exciting the qubits to higher energy levels through heterogeneous multi-photon resonant processes. This allows the qubits to undergo sophisticated manipulations such as parametric conversions and perform complex quantum logical operations for the development of quantum computers, which were constrained to two levels in existing designs. The detailed birds-eye view is illustrated in FIG. 6.

Figure 6:
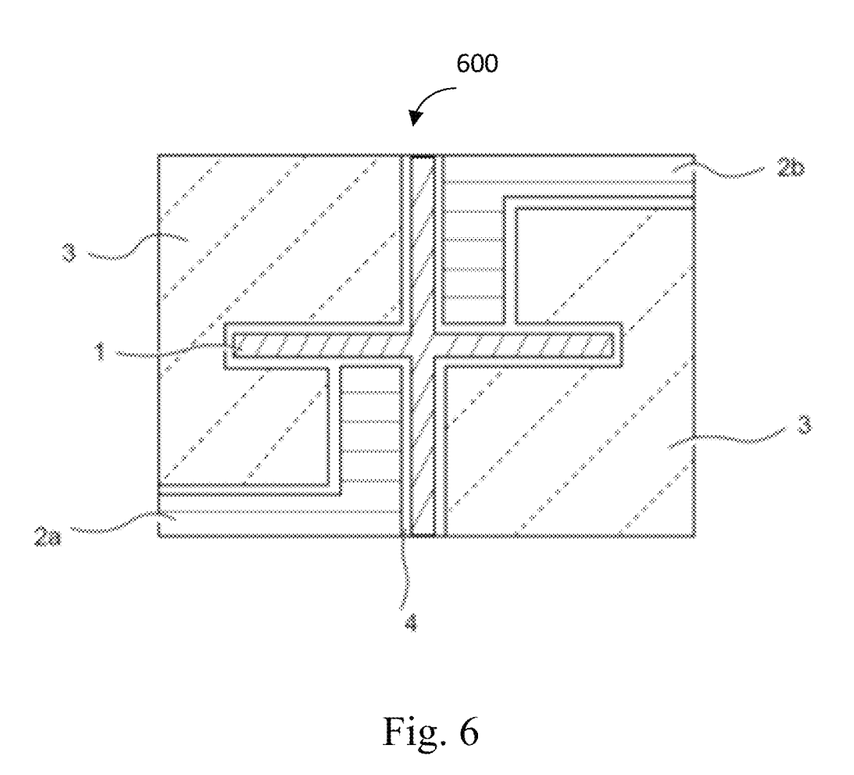
FIG. 6. illustrates another example of the cross-shape resonator in a detailed birds-eye view.
Figure 7:
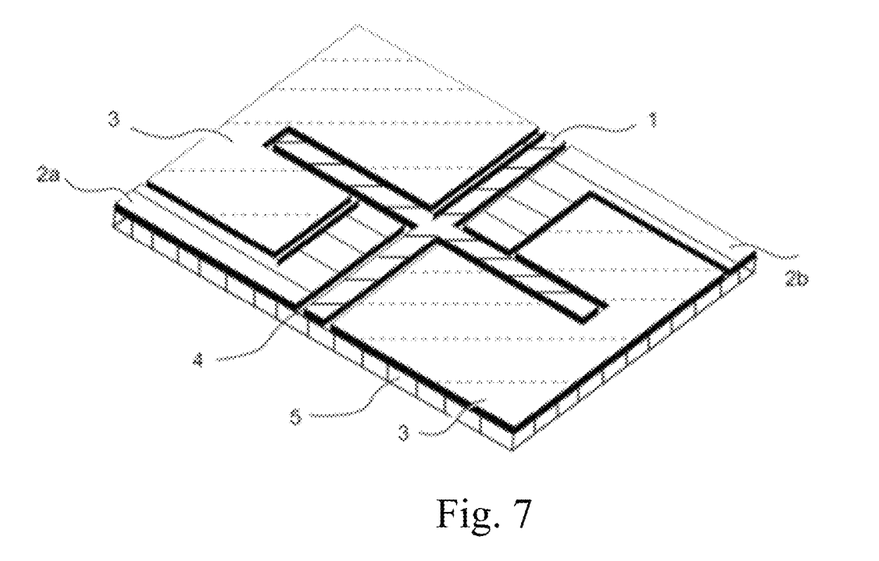
FIG. 7. illustrates another example of the cross-shape resonator in a 45-degree projective view.

In FIG. 6, the cross shaped resonator (CSR) 600 consists of four connecting stubs 1. The structure of the CSR is centrosymmetric. Here, the CSR further includes L-shape input-output conductors 2a and 2b, which are placed along each of the two stubs. The two fluted ground planes 3 surround CSR tightly. There are gaps 4 between the CSR and the ground plane. The CSR is coupled capacitively by the L-shape conductors along each of the two stubs through the gaps 4. The 45-degree projective schematics are illustrated in FIG. 7, which also shows the silicon substrate 5.

It will be appreciated that the present disclosure is not limited to the exact construction that has been described above and illustrated in the accompanying drawings, and that various modifications and changes can be made without departing from the scope thereof.

What is claimed is:
1. A super conducting cavity quantum electrodynamics system, comprising:

a superconducting circuit comprising a cross-shape resonator (CSR) coupled with an artificial two-level system (TLS); and a microwave cavity coupled with the superconducting circuit, wherein the TLS comprises a bare two-level flux qubit with a level spacing of $h\nu_q=\sqrt{\varepsilon^2+\Delta^2}$, where $\varepsilon=2I_p(\Phi_e-\Phi_0/2)$ is an energy bias of the flux qubit depending on the external magnetic flux $\Phi_e$, $\Phi_0$ is defined as the flux quantum, $I_p$ is the persistent current in the superconducting loop, and where $\Delta$ is a tunneling energy of the two-level flux qubit; and wherein the CSR works as a quantum bus used to store information between independent qubits, and the CSR is coupled by an L-shape conductor along two stubs in a vertical direction capacitively.

2. The super conducting cavity quantum electrodynamics system of claim 1, wherein the flux qubit and the CSR are coupled via one of: edge coupling and L-shape coupling.

3. The super conducting cavity quantum electrodynamics system of claim 2, wherein the L-shape coupling includes L-shape coupling type with L=14 mm.

4. The super conducting cavity quantum electrodynamics system of claim 2, wherein the L-shape coupling operates on at least one of two coupling frequencies of: 5.47 GHz and 7.31 GHz.

5. The super conducting cavity quantum electrodynamics system of claim 1, wherein the CSR comprises four stubs with a centrosymmetric construction, and a plurality of ground planes surround the CSR with equivalent gaps in all directions.

6. A quantum information processing apparatus, comprising a super conducting cavity quantum electrodynamics system that comprises:

a superconducting circuit comprising a cross-shape resonator (CSR) coupled with an artificial two-level system (TLS); and a microwave cavity coupled with the superconducting circuit, wherein the CSR is coupled by an L-shape conductor along two stubs in a vertical direction capacitively.

7. The quantum information processing apparatus of claim 6, wherein the TLS comprises a bare two-level flux qubit with a level spacing of $h\nu_q=\sqrt{\varepsilon^2+\Delta^2}$, where $\varepsilon=2I_p(\Phi_e-\Phi_0/2)$ is the energy bias of the flux qubit depending on the external magnetic flux $\Phi_e$, $\Phi_0$ is defined as the flux quantum, $I_p$ is the persistent current in the superconducting loop, and where $\Delta$ is the tunneling energy of the two-level flux qubit.

8. The quantum information processing apparatus of claim 7, the CSR works as a quantum bus used to store information between independent qubits.

9. The quantum information processing apparatus of claim 8, wherein the flux qubit and the CSR are coupled via one of: edge coupling and L-shape coupling.

10. The quantum information processing apparatus of claim 9, wherein the L-shape coupling includes L-shape coupling type with L=14 mm.

11. The quantum information processing apparatus of claim 10, wherein the L-shape coupling operates on at least one of two coupling frequencies of: 5.47 GHz and 7.31 GHz.

12. The quantum information processing apparatus of claim 6, wherein the CSR comprises four stubs with a centrosymmetric construction, and a plurality of ground planes surround the CSR with equivalent gaps in all directions.

13. A super conducting cavity quantum electrodynamics system, comprising:

a superconducting circuit comprising a cross-shape resonator (CSR) coupled with an artificial two-level system (TLS); and a microwave cavity coupled with the superconducting circuit, wherein the CSR is coupled by an L-shape conductor along two stubs in a vertical direction capacitively.

* * * * *